United States Patent
Okabe et al.

(10) Patent No.: US 6,586,163 B1
(45) Date of Patent: Jul. 1, 2003

(54) METHOD OF FORMING FINE PATTERN

(75) Inventors: Ichiro Okabe, Kanagawa (JP); Hiroki Arai, Tokyo (JP)

(73) Assignees: Semiconductor Leading Edge Technologies Inc., Kanagawa (JP); ASM Japan K.K., Tokyo (JP)

(*) Notice: Subject to any disclaimer, the term of this patent is extended or adjusted under 35 U.S.C. 154(b) by 0 days.

(21) Appl. No.: 09/587,359

(22) Filed: Jun. 2, 2000

(30) Foreign Application Priority Data

Jun. 2, 1999 (JP) .......................................... 11-155511
Aug. 17, 1999 (JP) .......................................... 11-230903

(51) Int. Cl.$^7$ ............................................... G03F 7/00
(52) U.S. Cl. ..................... 430/317; 430/313; 430/327; 430/330; 216/41
(58) Field of Search ................................ 430/311, 313, 430/317, 327, 330; 216/41, 51

(56) References Cited

U.S. PATENT DOCUMENTS

| | | | |
|---|---|---|---|
| 5,783,365 A | 7/1998 | Tsujita | 430/311 |
| 5,789,141 A | 8/1998 | Usujima | 430/313 |

FOREIGN PATENT DOCUMENTS

| | | |
|---|---|---|
| EP | 0 840 361 | 5/1998 |
| JP | 2-278879 | 11/1990 |
| JP | 3-280540 | 12/1991 |
| JP | 6-349695 | 12/1994 |
| JP | 7-201708 | 8/1995 |
| JP | 7-201825 | 8/1995 |
| JP | 7-201859 | 8/1995 |
| JP | 7-273010 | 10/1995 |
| JP | 7-326608 | 12/1995 |
| JP | 8-172039 | 7/1996 |
| JP | 9-180981 | 7/1997 |
| JP | 10-189410 | 7/1998 |
| JP | 11-72924 | 3/1999 |

OTHER PUBLICATIONS

L. Asinovsky et al., Characterization of the optical properties of PECVD SiN$_x$ films using elliposometry and reflectometry, *Thin Solid Films, CH, Elsevier Science S.A. Lausanne*, vol. 313–314, pp. 198–204, Feb. 1, 1998.

A. Stephen et al., "Antireflective coating strategies for 193–nm lithography", Advances in Resist Technology and Processing XVI, Santa Clara, CA, USA, vol. 3678, pt. 1–2, pp. 1315–1322, Mar. 15–17, 1999.

*Primary Examiner*—Kathleen Duda
(74) *Attorney, Agent, or Firm*—Foley & Lardner

(57) ABSTRACT

There is described a method of forming a fine pattern aimed at depositing a silicon-nitride-based anti-reflection film which is stable even at high temperature and involves small internal stress. The method is also intended to preventing occurrence of a footing pattern (a rounded corner) in a boundary surface between a photoresist and a substrate at the time of formation of a chemically-amplified positive resist pattern on the anti-reflection film. The method includes the steps of forming a silicon-nitride-based film directly on a substrate or on a substrate by way of another layer; and forming a photoresist directly on the silicon-nitride-based film or on the silicon-nitride-based film by way of another layer. The silicon-nitride-based film is deposited while the temperature at which the substrate is to be situated is set so as to fall within the range of 400 to 700° C., through use of a plasma CVD system. The method further includes a step of depositing a silicon-oxide-based film immediately below the photoresist. The silicon-oxide-based film is deposited while the temperature at which the substrate is to be situated is set so as to fall within the range of 400 to 700° C., through use of a plasma CVD system.

12 Claims, 6 Drawing Sheets

Fig. 1
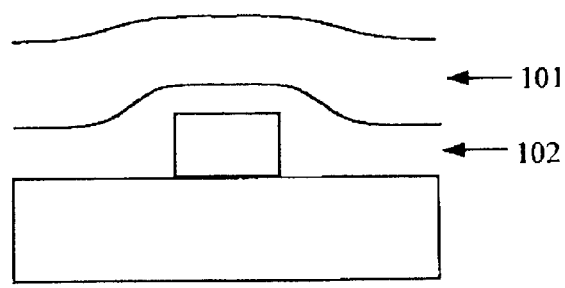
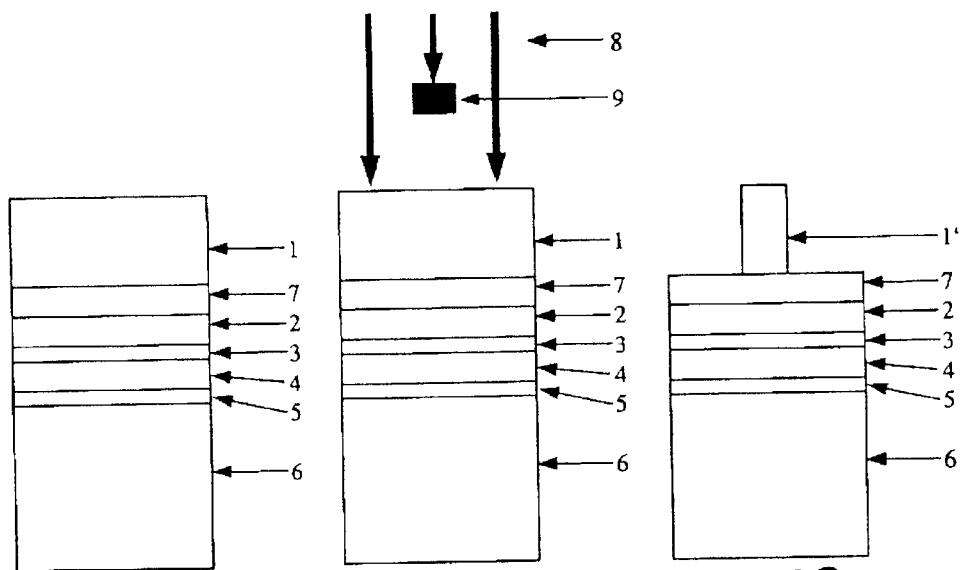
Fig. 2A   Fig. 2B   Fig. 2C
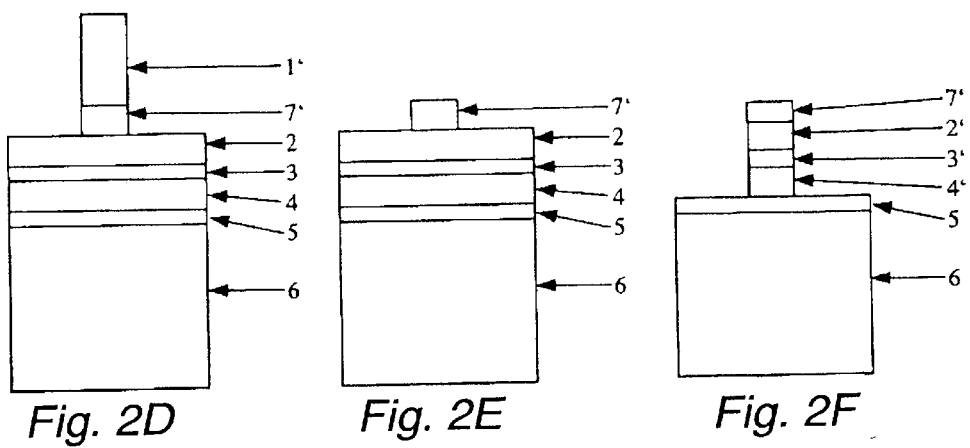
Fig. 2D   Fig. 2E   Fig. 2F Fig. 3
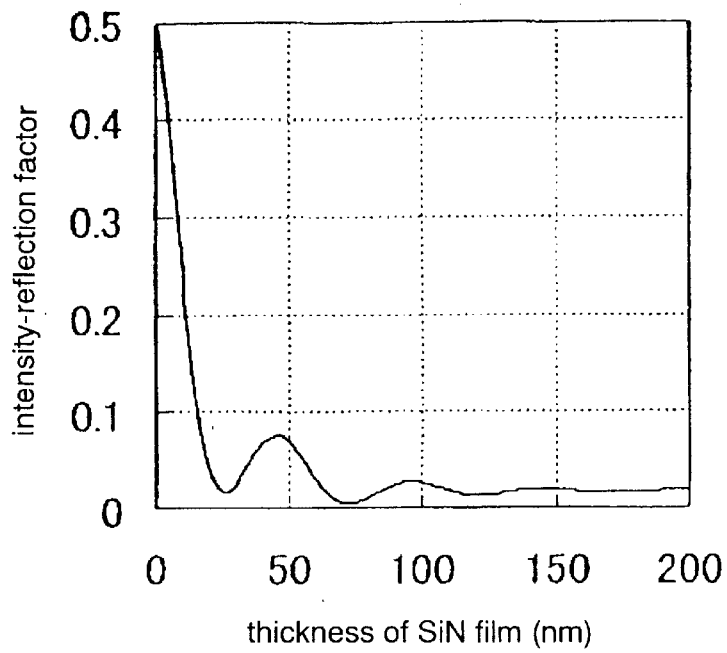
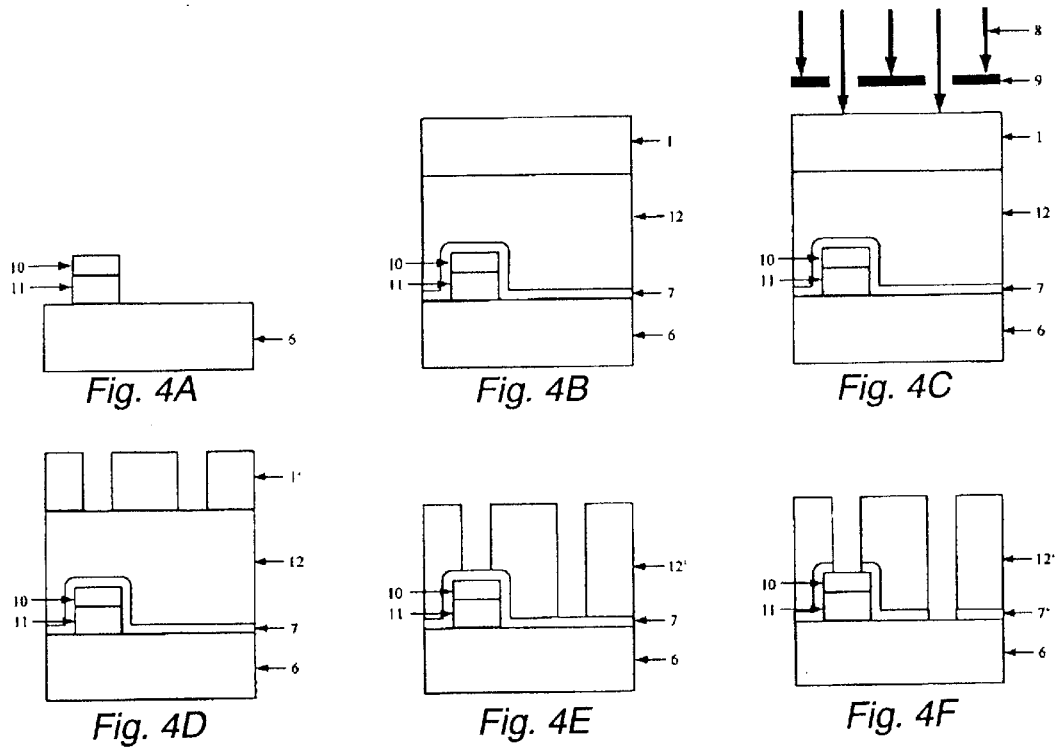
Fig. 4A  Fig. 4B  Fig. 4C
Fig. 4D  Fig. 4E  Fig. 4F

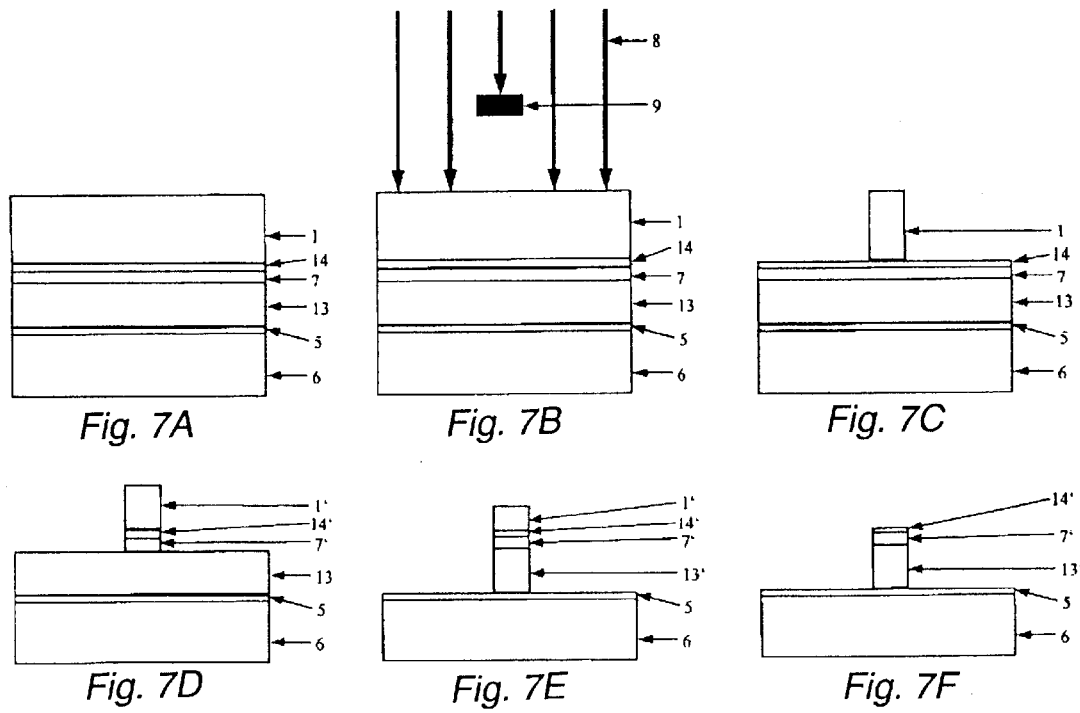
Fig. 7A  Fig. 7B  Fig. 7C
Fig. 7D  Fig. 7E  Fig. 7F
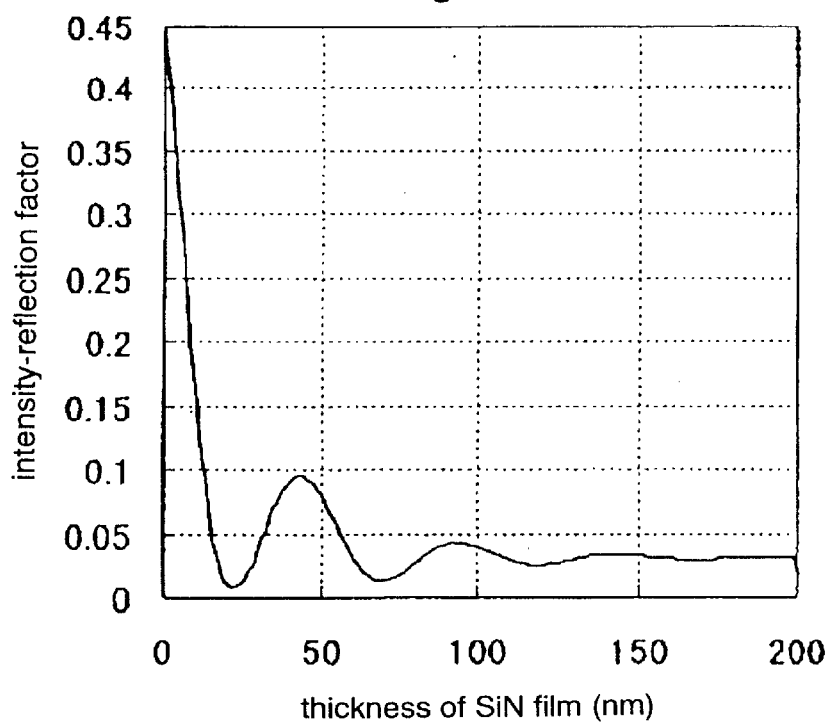
Fig. 8

METHOD OF FORMING FINE PATTERN

BACKGROUND OF THE INVENTION

1. Field of the Invention

The present invention relates to a new method of forming a fine pattern through use of a nitride-silicon-based film. Particularly, the present invention relates to a method of forming a fine pattern, which can minimize the effectiveness of a standing wave in a photoresist film during a photolithography step at the time of formation of a fine pattern and can improve the stability of a nitride-silicon-based film during a device fabrication step. The present invention can be utilized as, for example, a method of forming a fine pattern in the course of fabrication of a semiconductor device.

2. Description of the Background Art

A technique of diminishing the amount of exposing radiation reflected by a substrate (i.e., an anti-reflection technique) has been known as a peripheral technique required for satisfying the dimensional precision and resolution needed in fabrication of an ULSI device. In the event that exposing radiation is reflected by a substrate, a thin-film interference phenomenon arises within a photosensitive thin film, such as a photoresist film. As a result of occurrence of the thin-film interference phenomenon, there arise variation in exposure light in the thicknesswise direction of the resist film, which inconsistencies are called standing waves, thereby resulting in deteriorated resolution of a resist pattern.

Further, in the event that exposing radiation is reflected by a substrate, there arise variations in the dimension of a pattern associated with variations in the thickness of a resist, the variations being called multiple interference. The variations in turn deteriorate the dimensional precision of the resist pattern. The exposing radiation reflected by the substrate randomly travels in an oblique direction, because of irregularities in the substrate. As a result, regions which are originally intended to be shielded may be exposed, thereby hindering formation of a desired pattern (i.e., resulting in occurrence of a halation phenomenon). The problem becomes more noticeable in proportion to the intensity of the light reflected from the substrate. Consequently, if the reflected light is diminished, the problem is prevented. For this reason the number of attempts to diminish the light reflected from the substrate becomes higher than ever.

Anti-reflection methods can be roughly divided into two categories. One of those is a method in which a so-called absorptive film or a film having the characteristic of strongly absorbing exposing radiation is employed as an anti-reflection film. The other is a method which prevent reflection utilizing light interference.

The former anti-reflection method is typified by an ARC (Anti-Reflective Coating) method under which an absorptive organic film is applied to a substrate in advance before coating of resist. The almost portion of light that has passed through a resist film and travels toward a substrate is absorbed by the absorptive organic film before the light reaches the surface of the substrate. Therefore, the intensity of the light which has returned from the substrate is diminished. The ARC method is described in "Proceeding of SPIE, Vol. 1463, pp. 16 to 29, 1991, as well as in Japanese Patent Application Laid-Open No. 93448/1984.

An example anti-reflection method using light interference is a method of depositing an anti-reflection film, such as $SiO_XN_Y$ or $SiN_X$, on a high-reflection substrate such as Al, W, Si, or WSi. According to this method, the thickness of the anti-reflection film is set such that the light reflected from a boundary surface between a photoresist film and an anti-reflection film is reverse in phase with the light reflected from a boundary surface between the anti-reflection film and the substrate. In this case, the reflected light rays cancel each reflected light which enters the photoresist film.

The latter anti-reflection method is described in Japanese Patent Application Laid-Open Nos. 6540/1984, 130481/1982, "Proceeding of SPIE" Vol. 2197, pp. 722 to 732, 1994, and "Technical Digests of International Electronic Device Meeting" pp. 399 to 402, 1982.

In a case where a substrate having a large step is subjected to the ARC method, as shown in FIG. 1, the portion of an anti-reflection film 102 located above the step becomes thinner than the portion of the same surrounding the step. For this reason, the thickness of the anti-reflection film 102 must be set to a sufficient value in consideration of the diminished thickness portion of the anti-reflection film located above the step. However, in a case where a thick anti-reflection film is used for forming a fine pattern, the ratio of the thickness of the anti-reflection film to the width of a pattern; that is, an aspect ratio, becomes very large. In this case, processing of an anti-reflection film becomes very difficult, wherewith a failure, such as a tilt, is likely to arise in the thus-formed pattern.

The anti-reflection film, which is made of $SiO_XN_Y$ or $SIN_X$ and is used for preventing reflection through utilization of light interference, can be deposited by means of the CVD method. Even in a case where a step arises in the substrate, a uniform thickness can be attained. Therefore, the anti-reflection method utilizing light interference provides an anti-reflection effect better than that achieved by the ARC method.

The surface of an anti-reflection film, which is made of, e.g., $SiO_XN_Y$ or $SiN_X$ and has conventionally been used for the anti-reflection method utilizing light interference, contains a large amount of basic nitrogen. In a case where the substrate is exposed while a positive chemically-amplified resist is applied to the anti-reflection film, acid contained in the resist bonds to the lone pair of electrons of each of nitrogen atoms contained in the surface of the anti-reflection film during the course of a baking step (PEB step) to which the resist is to be subjected after exposure. As a result, there arises a reduction in the acid content in the boundary surface between the resist and the substrate.

The photoresist has the property such that an area whose acid content is decreased is less soluble in a developer solution. Because of this property, in the event of a reduction arising in the acid content in the boundary surface between the photoresist and the substrate, rounded corners are likely to arise in the resist pattern. The rounded corners are not preferable, because control of a pattern width is deteriorated by the rounded corners arising in the resist pattern.

In order to solve the problem, there has been proposed a method of applying a photoresist to a substrate after a nitrogen-free substance (for example, an SiO film prepared through use of the plasma CVD technique) has been deposited on the surface of an anti-reflection film (Japanese Patent Application Laid-Open No. 189441/1998). However, the test conducted by the inventors has shown that occurrence of rounded corners cannot be prevented by means of depositing an SiO film on an anti-reflection film.

In a case where an anti-reflection film, which is made of $SiO_XN_Y$ or $SiN_Y$, is deposited on a substrate at a temperature of, for example, less than 400° C., by means of the plasma CVD technique, the resultant anti-reflection film contains a large amount of hydrogen atoms. If the device fabrication process is carried out while the anti-reflection film containing a large amount of hydrogen atoms is left in the semiconductor device, hydrogen contained in the anti-reflection film desorbs from the film and spreads in interconnections, which are made of amorphous silicon or copper, or an interlayer film, such as a BPSG, as the wafer undergoes various baking steps to be carried out during the course of the fabrication process. Spreading of hydrogen involves degradation of interconnections or an interlayer film, which in turn deteriorates the reliability of a semiconductor device.

For instance, in the case of the step shown in FIG. 4, the step of depositing the anti-reflection film 7 is followed by a step of forming an interlayer film 12 (for example, a BPSG film) and a reflow step. These steps are usually performed at a temperature ranging from 700 to 800°C., and the composition of the anti-reflection film 7 is changed. In a case where a nitride-silicon-based film is deposited according to the conventional method, the hydrogen contained in the anti-reflection film 7 (the hydrogen is contained in combination with an Si—H bond or N—H bond) desorbs from the film, thus changing the composition of the anti-reflection film. Consequently, a change may arise in the optical constant of the anti-reflection film, or in internal stress of the anti-reflection film, or exfoliation of the anti-reflection film may arise. The anti-reflection film which has undergone such a change fails to act as an anti-reflection film and adversely affects various features of a semiconductor device.

Removal of the anti-reflection film immediately after the fine pattern formation step is effective for preventing degradation in a semiconductor device, which would otherwise be caused by desorption of hydrogen. However, such a measure for removing an anti-reflection film directly involves an increase in the number of manufacturing steps.

A low-pressure CVD technique is also conceivable as a method of depositing an anti-reflection film made of $SiO_XN_Y$ or $SiN_X$. The low-pressure CVD technique enables a reduction in the concentration of hydrogen atoms contained in an anti-reflection film. However, deposition of an anti-reflection film through use of the low-pressure CVD technique involves a necessity of heating a substrate to a temperature of about 800° C.

Heat treatment at such a high temperature may cause thermal deformation of a substrate. Further, an anti-reflection film deposited through low-pressure CVD usually has high internal stress, wherewith the substrate is likely to cause deformation. A substrate for use in fabricating a semiconductor device is expected to enlarge further and further in the future, and hence prevention of thermal deformation and internal stress of a substrate continue grow in importance.

As mentioned previously, the method of preventing the influence of reflected light through use of an anti-reflection film, which is made of $SiO_XN_Y$ or $SiN_X$, is superior to the ARC method. However, the method involves problems; that is, (1) a problem of rounded corners being likely to arise in a resist pattern, (2) a problem of the reliability of a semiconductor device being likely to decrease, and (3) a problem of a substrate being apt to cause deformation.

SUMMARY OF THE INVENTION

The present invention has been conceived to solve such a problem and is aimed at providing a method of forming a fine pattern which can prevent deformation of a substrate and a reduction in the reliability of a semiconductor device and which enables accurate formation of a fine resist pattern.

The above objects of the present invention are achieved by a fine pattern formation method under which a fine pattern is formed by means of applying a photoresist over a underlying substrate, exposing the photoresist to light of a single wavelength so as to form a fine resist pattern, and etching the underlying substrate while the resist pattern is used as a mask. In the method, a silicon-nitride-based film is formed on the underlying substrate directly or by way of another layer. A photoresist is formed on the silicon-nitride-based film directly or by way of another layer. The photoresist is exposed to light, to thereby transfer a mask pattern onto the photoresist. The silicon-nitride-based film is etched while the thus-transferred resist pattern is taken as a mask.

Other objects and further features of the present invention will be apparent from the following detailed description when read in conjunction with the accompanying drawings.

BRIEF DESCRIPTION OF THE DRAWINGS

FIG. 1 is a conceptual drawing for describing problems of a conventional ARC method;

FIGS. 2A through 2F are sectional views for describing manufacturing steps of a first embodiment of the present invention and a first comparative example;

FIG. 3 is a graph showing a relationship between an intensity-reflection ratio of a resist-substrate boundary region and a film thickness of a silicon nitride film in the first embodiment and the first comparative example;

FIGS. 4A through 4F are sectional views for describing manufacturing steps of a second embodiment of the present invention and a second comparative example;

FIGS. 7A through 7F are sectional views for describing manufacturing steps of a third embodiment of the present invention and a third comparative example;

FIG. 8 is a graph showing a relationship between an intensity-reflection ratio of a resist-silicon oxide boundary surface and a film thickness of a silicon nitride film in the third embodiment;

DESCRIPTION OF THE PREFERRED EMBODIMENTS

First Embodiment

Figure 5A:
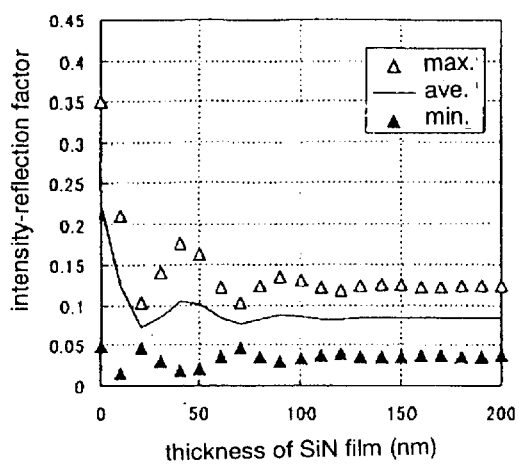
FIG. 5A is a graph showing a relationship between an intensity-reflection ratio of an underlayer 1 of a resist-BPSG boundary surface and a film thickness of a silicon nitride film in the second embodiment.

A first embodiment of the present invention will be described hereinbelow by reference FIGS. 2A through 2F and FIG. 3.

FIGS. 2A through 2F are illustrations for describing manufacturing steps of a fine pattern formation method according to the first embodiment. In FIGS. 2A through 2F, reference numeral 1 designates a photoresist; 1' designates a photoresist pattern; 2 designates a tungsten film (W film) before processing; 2' designates a tungsten film after processing; 3 designates a titanium nitride (TiN film) before processing; 3' designates a titanium nitride (TiN film) after processing; 4 designates a polysilicon film before processing; and 4' designates a polysilicon film after processing. Further, reference numeral 5 designates a silicon oxide film ($SiO_2$ film); 6 designates a substrate; and 7 designates a silicon nitride film. Moreover, reference numeral 8 designates exposing radiation used for exposure of the photoresist 1, and 9 designates a mask used for exposure.

As shown in FIGS. 2A through 2F, under the fine pattern formation method according to the present embodiment, the silicon nitride film 7 is deposited over the substrate 6 which is an object of processing, by means of the plasma CVD technique. The photoresist 1 is formed on the silicon nitride film 7. In the present embodiment, a polyacryl-based positive ArF resist (manufactured by Clariant) is used as the photoresist 1.

The optical constant of the photoresist 1, that of the silicon nitride film 7, that of the tungsten film 2, and that of the TiN film 3 are determined through use of a spectroscopic-ellipsometer, in order to calculate the reflection ratio of a boundary surface between the photoresist 1 and the silicon nitride film 7. As a result, optical constants such as those provided in Table 1 are obtained through use of light of a wavelength of 193 nm. A plasma CVD system (ASM Japan) is used for depositing the silicon nitride film 7 at a temperature of 500° C. while $SiH_4$ (200 sccm) and $N_2$ (1000 sccm) gases are employed as material gases.

TABLE 1

OPTICAL CONSTANTS OF FILMS EMPLOYED IN THE FIRST EMBODIMENT

| SUBSTANCE | REFLECTION RATIO | EXTINCTION COEFFICIENT |
| --- | --- | --- |
| PHOTORESIST (MANUFACTURED BY CLARIANT CO., LTD.) | 1.71 | 0.018 |
| SILICON NITRIDE | 1.959 | 0.448 |
| TUNGSTEN (W) | 1.305 | 3.201 |
| TiN | 1.972 | 1.629 |

The reflection ratio of the region ranging from the photoresist 1 to the boundary surface formed between the $SiO_2$ film 5 and the substrate 6 (which region is referred to as a "resist-substrate boundary region" hereunder) is calculated through use of the optical constants provided in Table 1, wherewith the following properties are determined.

FIG. 3 shows a calculation result of the relationship between the intensity-reflection ratio of the resist-substrate boundary region, that is, the ratio between the intensity I of incident light and the intensity R of reflected light (i.e., I/R ratio) and the thickness of the silicon nitride film 7. The result shown in FIG. 3 is obtained when the photoresist 1 having the optical constant shown in Table 1 is exposed to light while being applied to the under lying layer having the structure shown in FIG. 2B (corresponding to the region ranging from the substrate 6 to the silicon nitride film 7).

Such calculation can be performed through use of a computation method which is described in detail in a publication, such as "Basic Optics" pg. 255 (published by Gendai Kogaku and written by Keiei KUDO and Fumiya UEHARA). As can be seen from the results shown in FIG. 3, in a case where an anti-reflection film (i.e., the silicon nitride film 7) has a thickness of 73 nm, the reflection factor of the substrate is minimized, and superior control of a linewidth can be expected.

In order to maximize an improvement in the control of a linewidth, there are adopted requirements under which the region ranging from the photoresist 1 to the boundary of the substrate 6 assumes the minimum reflection factor in this embodiment. However, there is no necessity for the region assuming the minimum reflection factor. The only requirement is that the intensity-reflection factor of the resist-substrate boundary region is reduced to such an extent that a dimensional precision required for the photolithography step can be attained.

Under the fine pattern formation method according to the first embodiment, the silicon nitride film 7 having a thickness of 73 nm is deposited on the tungsten film 2 through use of the plasma CVD technique. Subsequently, the photoresist 1 having an optical constant, such as that provided in Table 1, is applied to the silicon nitride film 7 to a thickness of 0.5 μm (FIG. 2A).

A pattern is formed on a wafer through exposure to light, by use of an ArF excimer laser stepper (FIG. 2B). The wafer is immersed in a developer solution; i.e., an organic alkaline-based solution such as a tetramethylammoniumhydroxide solution, wherewith a dense line pattern 0.15 μm is formed (FIG. 2C).

Observation of the thus-formed resist pattern 1' through use of an SEM (scanning electron microscope) shows substantially no roughness of a side surface of the resist pattern 1'. This means that inconsistencies have not occurred in exposure in the thicknesswise direction of the resist pattern 1'; namely, this means that the thin-film interference effect due to the light reflected from the substrate is diminished. Further, it is ascertained that the fine pattern formation method of the present invention prevents occurrence of distortion in the resist pattern 1', which would otherwise be caused by the light irregularly reflected from the substrate. Specifically, it is ascertained that prevention of a halation phenomenon and production of a good resist pattern have been accomplished.

According to the fine pattern formation method of the first embodiment, the silicon nitride film 7 is etched while the thus-produced resist pattern 1' is used as a mask, to thereby transfer a mask pattern onto the wafer (FIG. 2D). In the present embodiment, etching of the silicon nitride film 7 is performed through use of an etching system (TCP-9400) manufactured by Lam research Co. Ltd. while $CHF_3$ is taken as an etching gas.

The substrate 6 is then exposed to an oxygen plasma atmosphere, to thereby remove the resist pattern 1' (FIG. 2E). The substrate 6 is then etched while the thus-patterned silicon nitride film 7' is used as a mask. Etching of the substrate 6 is performed through use of a Prototype Etching System of Applied Materials Co. Ltd. while a mixed gas consisting of HBr, $Cl_2$, and $O_2$ is used as an etching gas. A dense interconnection pattern having a 0.15 μm-linewidth dense pattern can be transferred onto the substrate 6 through the round of steps set forth (FIG. 2F).

Table 2 shows results that have been obtained by means of examining variations in the linewidths of 25 interconnection patterns on the surface of the wafer through use of a Critical Dimension Measurement System ESPA-61 (Holon Co., Ltd.). As can be seen from Table 2, variations in linewidth within the wafer surface are expressed as 3-sigma values and assume a value of 9.7 nm. All the interconnection patterns measured assume a design value of 150 nm. The results of measurement show that the fine pattern formation method of the first embodiment has sufficient dimensional controllability.

TABLE 2

| | THICKNESS OF SILICON NITRIDE FILM | VARIATIONS IN LINEWIDTH (3-sigma VALUE) |
|---|---|---|
| FIRST EMBODIMENT | 73 nm | 9.7 nm |
| COMPARATIVE EXAMPLE 1 | 8 nm | 19.2 nm |

Comparative Example 1

Comparative example 1 for comparison with the method employed in the first embodiment will now be described. According to a fine pattern formation method of the comparative example, the silicon nitride film 7 is deposited over the substrate 6 shown in FIG. 2A by means of the plasma CVD technique, as in the case of the first embodiment. Subsequently, a photoresist layer is formed on the silicon nitride film 7 from, for example, a polyacryl-based positive resist.

In contrast with the silicon nitride film 7 employed in the first embodiment, the silicon nitride film 7 of the present comparative example is formed to a thickness of 8 nm. In other respects, the manufacturing steps employed in the comparative example are the same as those employed in the first embodiment. Provided that the intensity-reflection factor of the resist-substrate boundary region is calculated according to the same method as that employed in the first embodiment, the resist-substrate boundary region formed on the wafer according to comparative example 1 assumes an intensity-reflection factor of 34% (FIG. 3).

Variations in the linewidth of the interconnection pattern were examined at 25 points on the wafer through use of Critical Dimension Measurement System ESPA-61 (manufactured by Holon Co., Ltd.). The resultant variations are expressed as three-sigma values and assume a value of 19.2 nm (Table 2). As descrived above, the linewidth controllability ensured by the comparative example 1 is deteriorated compared with that achieved by the first embodiment, by the amount corresponding to the magnitude of the intensity-reflection factor of the resist-substrate boundary region.

In the first embodiment, the wavelength of exposing radiation used for irradiating the photoresist 1 is limited to a value of 193 nm. However, the present invention is not limited to such a value and can yield the same advantage in the case where exposing radiation assumes a wavelength of 195 nm or less.

In the first embodiment, the refractive index of the silicon nitride film 7 is limited to a value of 1.959, and the extinction coefficient of the same is limited to a value of 0.448. However, the present invention is not limited to these values. More specifically, so long as the refractive index of the silicon nitride film 7 falls within the range of 1.4 to 3.5 and the extinction coefficient of the same falls within the range of 0.2 to 0.8, there can be yielded the same advantage as that yielded by the first embodiment.

In the first embodiment, the thickness of the silicon nitride film 7 is limited to a value of 73 nm. However, the thickness is not limited to such a value and assumes any value within the range of 10 to 200 nm.

Although in the first embodiment the temperature at which the silicon nitride film 7 is deposited through CVD is limited to 500° C., in the present invention the temperature is not limited to such a value and may assume any value within the range of 400 to 700° C.

In the first embodiment, the required amount of gas required for forming the silicon nitride film 7 is limited to $SiH_4$ (200 sccm)/$N_2$ (1000 sccm). However, the required amount of gas are not limited to such a ratio and may assume any ratio, so long as the amount of ammonium contained in source gas assumes a value of 10 mol % or less.

Second Embodiment

A second embodiment of the present invention will now be described by reference to FIGS. 4A through 6B.

FIGS. 4A through 4F are illustrations for describing steps of a fine pattern formation method according to the second embodiment. In FIGS. 4A through 4F, those elements which are identical with or correspond to those shown in FIGS. 2A through 2F are assigned the same reference numerals, and repetition of their explanations is omitted here.

In FIGS. 4A through 4F, reference numeral 10 designates a processed tungsten silicide film (WSi film); 11 designates a processed amorphous silicon film; 12 designates a BPSG film before processing; and 12' designates a BPSG film after processing. An oxide silicon film (not shown) is interposed between the amorphous silicon film 11 and the substrate 6, to thereby isolate the film and substrate from each other.

As shown in FIGS. 4A through 4F, according to the fine pattern formation method of the second embodiment, the silicon nitride film 7 is deposited on the substrate 6 having a gate interconnection patterned thereon, by means of the plasma CVD technique. In the present embodiment, a wafer having a diameter of 300 nm for use in fabricating a semiconductor device is used as the substrate 6. The BPSG film 12 doped with boron and phosphorus is deposited on the silicon nitride film 7 to a thickness of about 1000 nm. Further, the photoresist 1 is formed on the BPSG film 12. In the present embodiment, a cycloolefin-based positive resist (Tokyo-ohka Co. Ltd.) is used as the photoresist 1.

The optical constant of the photoresist 1, that of the BPSG film 12, that of the silicon nitride film 7, and that of the WSi film 10 are determined through use of a spectro-ellipsometer, in order to calculate the reflection factor of a boundary surface between the photoresist 1 and the BPSG film 12 (hereinafter referred to as a "resist-BPSG boundary surface"). As a result, the intensity-reflection factors of reflected light such as those shown in Table 3 are obtained through use of light of a wavelength of 193 nm. The silicon nitride film 7 is deposited through use of the plasma CVD system (ASM Japan Co. Ltd.), as in the case of the first embodiment. At this time, requirements for forming the silicon nitride film 7 are set as follows:

Temperature at which a film is to be formed: 500° C.

Gases: $SiH_4$ (200 sccm), $N_2$ (1000 sccm)

TABLE 3

OPTICAL CONSTANTS OF FILMS

| SUBSTANCE | REFRACTIVE INDEX | EXTINCTION COEFFICIENT | REMARKS |
|---|---|---|---|
| PHOTORESIST FILM (TOKYO-OKA) | 1.70 | 0.018 | USED IN THE SECOND EMBODIMENT AND COMPARATIVE EXAMPLE 2 |
| SILICON NITRIDE FILM | 1.959 | 0.448 | USED IN THE SECOND EMBODIMENT |
| SILICON NITRIDE FILM | 2.663 | 0.240 | USED IN COMPARATIVE EXAMPLE 2 |
| WSi FILM | 1.052 | 2.223 | USED IN THE SECOND EMBODIMENT AND COMPARATIVE EXAMPLE 2 |
| BPSG FILM | 1.562 | 0.000 | USED IN THE SECOND EMBODIMENT AND COMPARATIVE EXAMPLE 2 |

As can be seen from FIGS. 4A through 4F, the underlayer of the photoresist 1 has two types of structures; one type is a multilayer structure comprising a BPSG film 12/the silicon nitride film 7/the WSi film 10/the amorphous silicon film 11/an oxide silicon film (not shown)/the silicon substrate 6, and another type is a multilayer structure comprising the BPSG film 12/the silicon nitride film 7/the silicon substrate 6.

Figure 5B:
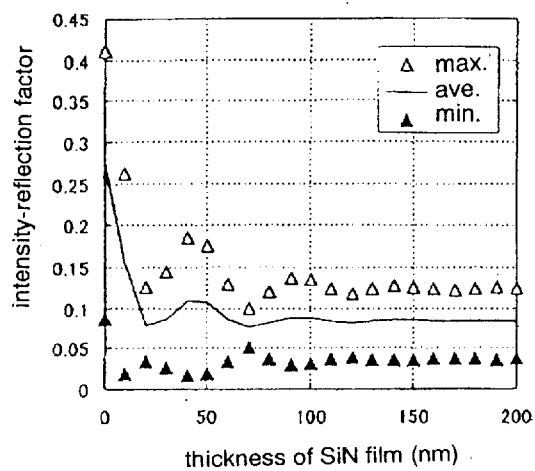
FIG. 5B is a graph showing a relationship between an intensity-reflection ratio of an underlayer 2 of a resist-BPSG boundary surface and a film thickness of a silicon nitride film in the second embodiment.

Portion of the underlayer having the former structure is expressed by "underlayer 1, and that having the latter structure is expressed by underlayer 2." In a case where underlayer 1 is employed, the intensity-reflection factor of the light reflected from the resist-BPSG boundary surface is calculated, as shown in FIG. 5A. In a case where underlayer 2 is employed, the intensity-reflection factor of the light reflected from the resist-BPSG boundary surface is calculated, as shown in FIG. 5B. As can be seen from these calculation results, even if the intensity-reflection factor of the light reflected from the resist-BPSG boundary surface varies according to the thickness of the BPSG film 12, so long as the thickness of the silicon nitride film 7 is set to a value of 70 nm, in either case the intensity-reflection factor of the reflected light can be controlled so as to fall within the range of 5 to 10%. Accordingly, setting thickness of the silicon nitride film 7 in such a manner can be expected to yield superior linewidth controllability.

According to the fine pattern formation method of the second embodiment, on the basis of the foregoing calculation results, the silicon nitride film 7 is formed on the WSi film 10 to a thickness of 70 nm by means of the plasma CVD technique. Subsequently, the BPSG film 12 is laid on the silicon nitride film 7, and the photoresist 1 having the optical constant provided in Table 3 is applied to the BPSG film 12 to a thickness of 0.7 μm (FIG. 4B).

A pattern is then transferred onto the wafer through exposure to light, by use of an ArF excimer laser stepper (FIG. 4C). The wafer is immersed in a developer solution; i.e., an organic alkaline-based solution such as a tetramethylammoniumhydroxide solution, wherewith a dense line pattern of 0.18 μm is formed (FIG. 4D).

Observation of the thus-formed resist pattern 1' being observed through use of an SEM shows that the roughness of a side surface of the pattern is sufficiently small and distortion in pattern size, which would otherwise be caused by the light irregularly reflected from the substrate, does not arise; specifically, it is ascertained that prevention of a halation phenomenon and production of a good resist pattern have been accomplished.

According to the fine pattern formation method of the second embodiment, the BPSG film 12 is etched while the thus-produced resist pattern 1' is used as a mask, to thereby transfer a mask pattern onto the wafer. In the present embodiment, etching of the BPSG film 12 is performed through use of a parallel plate Prototype Etching System (Tokyo Electron Co. Ltd.) while a mixed gas consisting of $CHF_3$ and $CF_4$ is taken as an etching gas.

The substrate 6 is then exposed to an oxygen plasma atmosphere, to thereby remove the resist pattern 1' (FIG. 4E). The silicon nitride film 7 is etched while the BPSG film 12' having a pattern transferred thereon is used as a mask. Etching of the silicon nitride film 7 is performed through use of a Prototype Etching System (Applied Materials Co. Ltd.) while the mixed gas consisting of $CF_4$ and $O_2$ is used as an etching gas. A hole pattern having a diameter of 0.18 μm can be transferred onto the substrate 6 through the round of steps set forth (FIG. 4F).

Variations in the diameters of 25 hole patterns within the surface of the wafer were examined through use of a Critical Dimension Measurement System ESPA-61 (Holon Co. Ltd.). Variations in the diameter of the hole patterns within the wafer are expressed as 3-sigma values and assume a value of 11.2 nm. All the hole patterns measured assume a design value of 180 nm. The results of measurement show that the fine pattern formation method of the second embodiment has sufficient dimensional controllability.

The degree of offset of a gate interconnection pattern formed on a substrate from its original position within the wafer after the wafer has undergone processing pertaining to steps FIGS. 4B through 4F is measured at 25 points on the surface of the wafer, through use of a long-dimension measurement system (Nikon). Table 4 shows results of calculation of three-sigma values of positional offsets. Positional offsets are considered to be attributable primarily to deformation of the wafer, which is induced during baking treatment in which the silicon nitride film 7 is deposited, as well as to the stress exerted on the thus-deposited silicon nitride film 7. The tolerance of positional offset is 20% or less of a linewidth. In a case where a linewidth corresponds to a value of 180 nm, the tolerance of a positional offset is 36 nm or less. From the measurement results provided in Table 4, it can be seen that, over the entire surface of the wafer formed according to the fine pattern formation method of the second embodiment, the positional offset of the gate interconnection pattern falls within the prescribed tolerance.

TABLE 4

MEASUREMENT RESULTS REGARDING POSITIONAL OFFSETS

| TESTS | THREE-SIGMA VALUES OF POSITIONAL OFFSETS (m) |
|---|---|
| SECOND EMBODIMENT | 32.4 |
| COMPARATIVE EXAMPLE 2 | 58.1 |

Comparative Example 2

A comparative example 2 for comparison with the second embodiment will now be described. As shown in FIGS. 4A through 4F, the silicon nitride film 7 is deposited on the substrate 6 having a gate structure patterned thereon, by means of the low-pressure CVD technique. Subsequently, The BPSG film 12 doped with boron and phosphorus is deposited on the silicon nitride film 7 to a thickness of about 1000 nm. Further, the photoresist 1 [in this comparative example, a cycloolefin-based positive resist (Tokyo-ohka Co. Ltd.) is used as the photoresist 1] is formed on the BPSG film 12. As in the case of the second embodiment, the silicon substrate 6 used in the present comparative example 2 corresponds to a wafer having a diameter of 300 nm for use in fabricating a semiconductor device.

In order to calculate the reflection factor of a boundary surface between the photoresist 1 and the BPSG film 12; that is, a resist-BPSG boundary surface, the optical constant of the silicon nitride film 7 deposited by means of the low-pressure CVD technique is measured through use of a spectro-ellipsometer. Consequently, intensity-reflection factor values such as those provided in Table 3 are obtained through use of light of a wavelength of 193 nm. In comparative example 2, the silicon nitride film 7 is deposited while a deposition temperature is set to 800° C., through use of a low-pressure CVD system (Tokyo Electron Co. Ltd.). The films employed in comparative example 2 other than the silicon nitride film 7 are identical with those employed in the second embodiment.

Figure 6A:
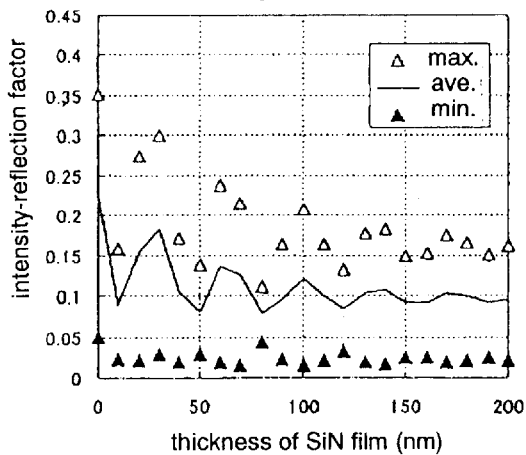
FIG. 6A is a graph showing a relationship between an intensity-reflection ratio of an underlayer 2 of a resist-BPSG boundary surface and a film thickness of a silicon nitride film in the second comparative example.
Figure 6B:
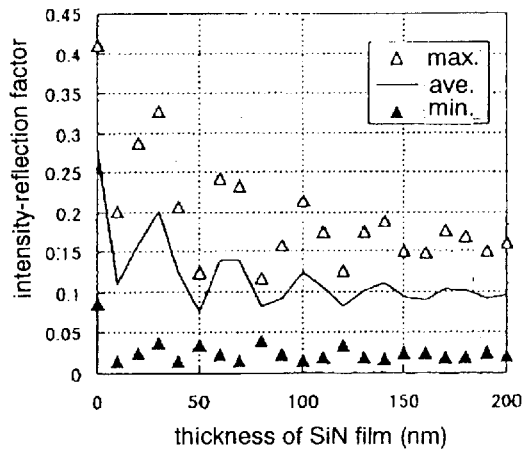
FIG. 6B is a graph showing a relationship between an intensity-reflection ratio of an underlayer 2 of a resist-BPSG boundary surface and a film thickness of a silicon nitride film in the second comparative example.

In a case where the underlayer 1 having the previously-described structure is exposed to light while the photoresist 1 having an optical constant, such as that provided in Table 3 is applied to the underlayer 1, the dependence of the intensity-reflection factor of the resist-substrate boundary surface on the thickness of the silicon nitride film 7 is determined through calculation, as in the case of the second embodiment. The results of calculation are shown in FIG. 6A. Similarly, in a case where the underlayer 2 having the previously-described structure is exposed to light while the photoresist 1 having an optical constant, such as that provided in Table 3 is applied to the underlayer 2, the dependence of the intensity-reflection factor of the resist-substrate boundary surface on the thickness of the silicon nitride film 7 is determined through calculation, as in the case of the second embodiment. The results of calculation are shown in FIG. 6B. As can be seen from these calculation results, so long as the thickness of the silicon nitride film 7 is set to a value of 80 nm, the intensity-reflection factor of the resist-substrate boundary surface can be controlled so as to fall within the range of 5 to 10%, in both the case of the underlayer 1 and the case of the underlayer 2. Accordingly, such a setting of thickness of the silicon nitride film 7 can be expected to yield superior linewidth controllability.

According to the fine pattern formation method of comparative example 2, on the basis of the foregoing calculation results, the silicon nitride film 7 is deposited on the WSi film 10 to a thickness of 80 nm, by means of low-pressure CVD. Subsequently, the BPSG film 12 is laid on the silicon nitride film 7, and the photoresist 1 having the optical constant provided in Table 3 is applied to the BPSG film 12 to a thickness of 0.7 $\mu$m (FIG. 4B).

A pattern is then transferred onto the wafer through exposure to light, by use of the ArF excimer laser stepper (FIG. 4C). The wafer is immersed in a developer solution; i.e., an organic alkaline-based solution such as a tetramethy-lammoniumhydroxide solution, wherewith a dense line pattern of 0.18 $\mu$m is formed (FIG. 4D).

Observation of the thus-formed resist pattern 1' through use of an SEM shows that the roughness of a side surface of the pattern is sufficiently small and distortion in pattern size, which would otherwise be caused by the light irregularly reflected from the substrate, does not occur; specifically, it is ascertained that prevention of a halation phenomenon and production of a good resist pattern have been accomplished. According to the same method as employed in the second embodiment, the BPSG film 12 and the silicon nitride film 7 are etched while the thus-produced resist pattern 1' is used as a mask, wherewith a hole pattern having a diameter of 0.18 $\mu$m can be transferred onto the wafer.

Variations in the diameters of 25 hole patterns within the surface of the wafer were examined through use of the Critical Dimension Measurement System ESPA-61 (Holon Co. Ltd.). Variations in the diameter of hole patterns within the wafer are expressed as 3-sigma values and assume a value of 12.1 nm. All the hole patterns measured assume a design value of 180 nm. From the results of measurement, it can be ascertained that the fine pattern formation method of comparative example 2 has the same dimensional controllability as that achieved by the second embodiment.

The degree of offset of a gate pattern formed on a substrate from its original position within the wafer after the wafer has undergone processing pertaining to steps FIGS. 4B through 4F is measured at 25 points on the surface of the wafer, through use of the long-dimension measurement system (Nikon). Table 4 shows results of calculation of three-sigma values of positional offsets. The results provided in Table 4 show that the positional offset of the gate interconnection pattern formed on the entire wafer produced according to the fine pattern formation method of comparative example 2 has become greater than the positional offset of the gate interconnection pattern formed on the wafer produced according to the fine pattern formation method of the second embodiment. This result is attributable to the fact that the wafer is exposed to a high temperature for a long period of time at the time of deposition of the silicon nitride film 7 according to the fine pattern formation method of comparative example 2, wherewith there arises deformation which is greater than that arising in the wafer in the second embodiment.

In comparative example 2, the exposing radiation radiated onto the photoresist 1 is limited to a wavelength of 193 nm. However, the present invention is not limited to such a wavelength. So long as the exposing radiation has a wavelength of 195 nm or less, there is yielded the same advantage as yielded in the previous embodiments.

In the second embodiment, the refractive index of the silicon nitride film 7 is limited to a value of 1.959, and the extinction coefficient of the same is limited to a value of 0.448. However, the present invention is not limited to these values. More specifically, so long as the refractive index of the silicon nitride film 7 falls within the range of 1.4 to 3.5 and the extinction coefficient of the same falls within the range of 0.2 to 0.8, there can be yielded the same advantage as that yielded by the second embodiment.

In the second embodiment, the thickness of the silicon nitride film 7 is limited to a value of 70 nm. However, the thickness is not limited to such a value and may assume any value within the range of 10 to 200 nm.

Although in the second embodiment the temperature at which the silicon nitride film 7 is deposited through CVD is limited to 500° C., the temperature is not limited to such a value and may assume any value within the range of 400 to 700° C.

In the second embodiment, the amounts of gas required for forming the silicon nitride film 7 are limited to $SiH_4$ (200 sccm)/$N_2$ (1000 sccm). However, the amounts of gas are not limited to such a ratio and may assume any ratio, so long as the amount of ammonium contained in source gas assumes a value of 10 mol % or less.

Third Embodiment

A third embodiment of the present invention will now be described by reference to FIGS. 7A through 10B.

FIGS. 7A through 7F are illustrations for describing steps of a fine pattern formation method according to the third embodiment. In FIGS. 7A through 7F, those elements which are identical with or correspond to those shown in FIGS. 2A through 2F or FIGS. 4A through 4F are assigned the same reference numerals, and repetition of their explanations is omitted here.

In FIGS. 7A through 7F, reference numeral 13 designates a polycrystalline silicon film before processing; 13' designates a processed polycrystalline silicon film after processing; 14 designates a silicon oxide film before processing; and 14' designates a silicon oxide film after processing. An oxide silicon film 5 is interposed between the polycrystalline silicon film 13 or 13' and the substrate 6, to thereby isolate the film 13 from the substrate 6.

As shown in FIGS. 7A through 7F, according to the fine pattern formation method of the third embodiment, the silicon nitride film 7 is deposited over the poly-silicon layer 13, by means of the plasma CVD technique. In the present embodiment, a silicon oxide film 14 is deposited on the silicon nitride film 7 to a thickness of about 10 nm by means of the plasma CVD technique. Further, the photoresist 1, which is made of, for example, a polyacrylic positive photoresist, is formed on the silicon oxide film 14. In the present embodiment, a resist (PAR-101, Sumitomo Chemical Co. Ltd.) for use with an ArF excimer laser is used as the photoresist 1. The silicon nitride film 7 is deposited under the same conditions as those employed in the first embodiment. The silicon oxide film 14 is deposited through use of a plasma CVD system (ASM Japan Co. Ltd.). At this time, requirements for depositing the silicon oxide film 14 are set as follows:

Temperature at which a film is to be deposited: 500° C.
Gases: $SiH_4$ (200 sccm), $N_2O$ (1000 sccm)

The optical constant of the photoresist 1 and that of the silicon oxide film 14 are determined through use of a spectro-ellipsometer, in order to calculate the reflection factor of a boundary surface between the photoresist 1 and the silicon oxide film 14. As a result, the intensity-reflection factors of reflected light, such as those shown in Table 5, are obtained through use of light of a wavelength of 193 nm.

TABLE 5

OPTICAL CONSTANTS OF FILMS DETERMINED AT WAVELENGTH OF 193 nm

| SUBSTANCE | REFRACTIVE INDEX | EXTINCTION COEFFICIENT | REMARKS |
| --- | --- | --- | --- |
| PHOTORESIST FILM (SUMITOMO CHEMICAL) | 1.72 | 0.018 | USED IN THE THIRD EMBODIMENT, AND COMPARATIVE EXAMPLE 3 |
| SILICON NITRIDE FILM | 1.959 | 0.448 | USED IN THE THIRD EMBODIMENT, AND COMPARATIVE EXAMPLE 3 |
| SILICON OXIDE FILM (PREPARED AT 500° C.) | 1.562 | 0.000 | USED IN THE THIRD EMBODIMENT |
| SILICON OXIDE FILM (PREPARED AT 300° C.) | 1.521 | 0.000 | USED IN COMPARATIVE EXAMPLE 3 |
| AMORPHOUS SILICON FILM | 0.974 | 2.100 | USED IN THE THIRD EMBODIMENT AND COMPARATIVE EXAMPLE 3 |

The reflection factor of the resist-substrate boundary surface is calculated from the optical constants, to thereby determine the following characteristics:

In a case where the underlayer (corresponding to a region ranging from the substrate 6 to the silicon oxide film 14) having a structure shown in FIGS. 7A to 7F is exposed to light while the photoresist 1 having an optical constant such as that provided in Table 5 is applied to the underlayer, the dependence of the intensity-reflection factor of the resist-substrate boundary surface on the thickness of the silicon nitride film 7 is determined through calculation. The results of calculation are shown in FIG. 8. As can be seen from these calculation results, in a case where the thickness of the silicon nitride film 7 is set to a value of 24 nm, the intensity-reflection factor of the substrate can be controlled to 2% or thereabouts. Accordingly, such a setting of thickness of the silicon nitride film 7 can be expected to yield superior linewidth controllability.

Here, in order to maximize an improvement in the control of a linewidth, there are adopted requirements under which the photoresist-substrate boundary region assumes the minimum reflection factor. However, there is no necessity for the region assuming the minimum reflection factor. The only requirement is that there be selected requirements at which the intensity-reflection factor of the resist-substrate boundary region is reduced to such an extent that a dimensional precision required for the photolithography step can be attained.

Under the fine pattern formation method according to the third embodiment, the silicon nitride film 7 having a thickness of 24 nm is deposited on the polycrystalline film 13 through use of the plasma CVD technique. Subsequently, the silicon oxide film 14 is deposited on the silicon nitride film 7 to a thickness of 10 nm by means of the plasma CVD technique. Further, a photoresist (PAR-101) (Sumitomo Chemical Co. Ltd.) having an optical constant such as that provided in Table 5 is applied to the silicon oxide film 14 to a thickness of 0.3 $\mu$m (FIG. 7A).

A pattern is formed on the wafer through exposure to light, by use of an ArF excimer laser stepper (ISI Co. Ltd.) (FIG. 7B). The wafer is immersed in a developer solution; i.e., an organic alkaline-based solution such as a tetramethylammoniumhydroxide solution, wherewith a dense line pattern 0.15 µm is formed (FIG. 7C).

Figure 10A:
FIG. 10A is a sectional view of resist patterns of a 150 nm wide formed by the third embodiment.

Observation of the thus-formed resist pattern 1' through use of a SEM shows substantially no roughness of a side surface of the resist pattern 1'. It is also as certained that a distortion in the resist pattern 1', which would otherwise arise in the resist-silicon oxide film boundary surface, has not occurred (FIG. 10A).

According to the fine pattern formation method of the third embodiment, the silicon nitride film 7 is etched while the thus-produced resist pattern 1' is used as a mask, to thereby transfer a mask pattern onto the wafer (FIG. 7D). In the present embodiment, etching of the silicon nitride film 7 is performed through use of an etching system (TCP-9400 manufactured by Lam Research Co. Ltd.) while $CHF_3$ is taken as an etching gas.

The substrate 6 is etched while the thus-patterned silicon nitride film 7' is used as a mask (FIG. 7E). Etching of the substrate 6 is performed through use of a Prototype Etching System (Applied Materials Co. Ltd.) while a mixed gas consisting of HBr, $Cl_2$, and $O_2$ is used as an etching gas. Subsequently, the substrate 6 is exposed to an oxygen plasma atmosphere, thereby removing the resist pattern 1'. An interconnection pattern formed from the polycrystalline silicon film 13' having a thickness of 0.15 µm can be transferred onto the substrate 6 through the round of steps set forth (FIG. 7F).

Variations in the linewidths of 25 line patterns on the surface of the wafer were examined through use of the Critical Dimension Measurement System ESPA-61 (Holon Co., Ltd.). As in the case of the first embodiment, variations in linewidth within the wafer surface are expressed as a 3-sigma value and assume a value of 9.7 nm (Table 2). All the line patterns measured assume a design value of 150 nm. The results of measurement show that the fine pattern formation method of the third embodiment has sufficient dimensional controllability.

Comparative Example 3

A comparative example 3 for comparison with the third embodiment will now be described. As shown in FIGS. 7A through 7F, the silicon nitride film 7 is deposited over the poly-silicon layer 13, by means of the plasma CVD technique. Subsequently, the silicon oxide film 14 is deposited on the silicon nitride film 7, by means of the plasma CVD technique. Further, the photoresist 1 is made of, for example, a polyacrylic positive resist, on the silicon oxide film 14. In comparative example 3, the silicon oxide film 5 is deposited to a thickness of 2 nm on a silicon wafer having a diameter of 200 mm. An amorphous silicon film is further deposited on the silicon oxide film 5. The thus-formed wafer is used as a substrate to be processed.

In third example 3, a resist (PAR-101, Sumitomo Chemical Co. Ltd.) for use with an ArF excimer laser is used as the photoresist, as in the case of the third embodiment. The silicon nitride film 7 is deposited under the same conditions as those employed in the first embodiment. The silicon oxide film 14 is deposited through use of the plasma CVD system (ASM Japan Co. Ltd.).

The optical constant of the silicon oxide film 14 is determined in order to calculate the reflection factor of a boundary surface between the photoresist 1 and the silicon oxide film 14. As a result, the intensity-reflection factors of reflected light such as those shown in Table 5 are obtained through use of light of a wavelength of 193 nm.

Figure 9:
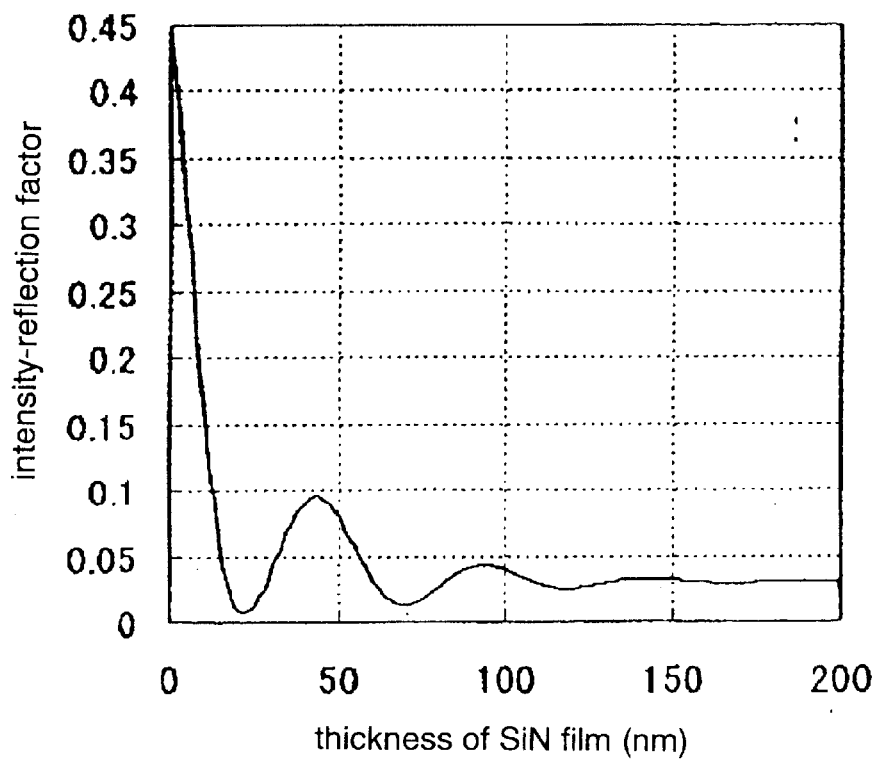
FIG. 9 is a graph showing a relationship between an intensity-reflection ratio of a resist-silicon oxide boundary surface and a film thickness of a silicon nitride film in the third comparative example.

The reflection factor of the resist-substrate boundary surface is calculated from the optical constants, to thereby determine the following characteristics:

In a case where the substrate (corresponding to a region ranging from the substrate 6 to the silicon oxide film 14) having the foregoing structure is exposed to light while the photoresist 1 having an optical constant such as that provided in Table 5 is applied to the substrate, the dependence of the intensity-reflection factor of the resist-substrate boundary surface on the thickness of the silicon nitride film 7 is determined through calculation. The results of calculation are shown in FIG. 9. As can be seen from these calculation results, in a case where the thickness of the silicon nitride film 7 is set to a value of 23 nm, the intensity-reflection factor of the substrate can be controlled to 2% or thereabouts. Accordingly, such a setting of thickness of the silicon nitride film 7 can be expected to yield superior linewidth controllability.

Under the fine pattern formation method according to the third comparative example, the silicon nitride film 7 having a thickness of 23 nm is deposited on the amorphous silicon film through use of the plasma CVD technique. Subsequently, the silicon oxide film 14 is deposited on the silicon nitride film 7 to a thickness of 10 nm at a temperature of 300° C., by means of the plasma CVD technique. Further, a photoresist (PAR-101) (Sumitomo Chemical Co. Ltd.) having an optical constant, such as that provided in Table 5 is applied to the silicon oxide film 14 to a thickness of 0.3 µm (FIG. 7A).

A pattern is formed on the wafer through exposure to light, by use of an ArF excimer laser stepper (FIG. 7B). The wafer is immersed in a developer solution; i.e., an organic alkaline-based solution such as a tetramethylammoniumhydroxide solution, wherewith a dense line pattern 0.15 µm is formed (FIG. 7C).

Figure 10B:
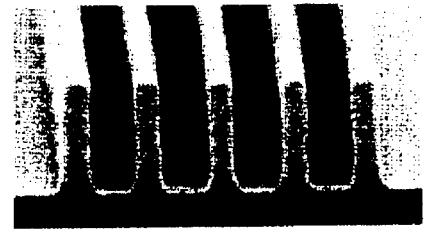
FIG. 10B is a sectional view of resist patterns of a 150 nm wide formed by the third comparative example.

Observation of the thus-formed resist pattern 1' through use of the SEM shows substantially no roughness of a side surface of the resist pattern 1' and that reflection of light by the substrate is prevented. However, through observation of the resist pattern 1' through use of the SEM, it is ascertained that a rounded corner pattern of the resist pattern 1' has occurred in the resist-silicon oxide film boundary surface (FIG. 10B).

According to the fine pattern formation method of the third comparative example, the silicon nitride film 7 is etched while the thus-produced resist pattern 1' is used as a mask, to thereby transfer a mask pattern onto the wafer (FIG. 7D). Etching of the silicon nitride film 7 is performed through use of an etching system (TCP-9400 manufactured by Lamb Research Co. Ltd.) while $CHF_3$ is taken as an etching gas.

The amorphous silicon layer is etched while the thus-patterned silicon nitride film 7' having the pattern transferred thereon is used as a mask (FIG. 7E). Etching of the substrate 6 is performed through use of a Prototype Etching System (Applied Materials Co. Ltd.) while a mixed gas consisting of HBr, $Cl_2$, and $O_2$ is used as an etching gas. Subsequently, the substrate 6 is exposed to an oxygen plasma atmosphere, thereby removing the resist pattern 1'. An interconnection pattern formed from the polycrystalline silicon film 13' having a thickness of 0.15 µm can be transferred onto the substrate 6 through the round of steps set forth (FIG. 7F).

Variations in the linewidths of 25 line patterns on the surface of the wafer were examined through use of a Critical Dimension Measurement System ESPA-61 (Holon Co., Ltd.). Variations in linewidth within the wafer surface are expressed as 3-sigma values and assume a value of 16.8 nm. From the results of examination, it is ascertained that the fine pattern formation method according to comparative example 3 is apt to cause greater variations in linewidth than that induced by the fine pattern formation method according to the third embodiment. Deterioration of variation in linewidth is attributable to the fact that since the resist pattern has a rounded corner shape, linewidth controllability during an etching step is deteriorated.

In comparative example 3, the exposing radiation radiated onto the photoresist 1 is limited to a wavelength of 193 nm. However, the present invention is not limited to such a wavelength. So long as the exposing radiation has a wavelength of 195 nm or less, there is yielded the same advantage as that yielded by the previous embodiments.

In the second embodiment, the refractive index of the silicon nitride film 7 is limited to a value of 1.959, and the extinction coefficient of the same is limited to a value of 0.448. However, the present invention is not limited to these values. More specifically, so long as the refractive index of the silicon nitride film 7 falls within the range of 1.4 to 3.5 and the extinction coefficient of the same falls within the range of 0.2 to 0.8, there can be yielded the same advantage as that yielded by the third embodiment.

In the third embodiment, the silicon nitride film 7 is deposited to the same thickness as that of the silicon nitride film 7 deposited in the first embodiment. The thickness of the silicon nitride film 7 and the temperature at which the silicon nitride film 7 is deposited are not limited to the previously-mentioned thickness and temperature. More specifically, the silicon nitride film 7 may assume any thickness within the range of 10 to 200 nm. Further, the silicon nitride film 7 may be deposited at any temperature within the range of 400 to 700° C.

In the second embodiment, the amounts of gas required for forming the silicon nitride film 7 are limited to $SiH_4$ (200 sccm)/$N_2$ (1000 sccm). However, the amounts of gas are not limited to such a ratio and may assume any ratio, so long as the amount of ammonium contained in source gas assumes a value of 10 mol % or less.

Although in the third embodiment the temperature at which the silicon nitride film 7 is deposited through CVD is limited to 500° C., the temperature is not limited to such a value and may assume any value within the range of 400 to 700° C.

Fourth Embodiment

A fourth embodiment and comparative example 4 of the present invention will now be described by reference to FIGS. 11 and 12.

Figure 11:
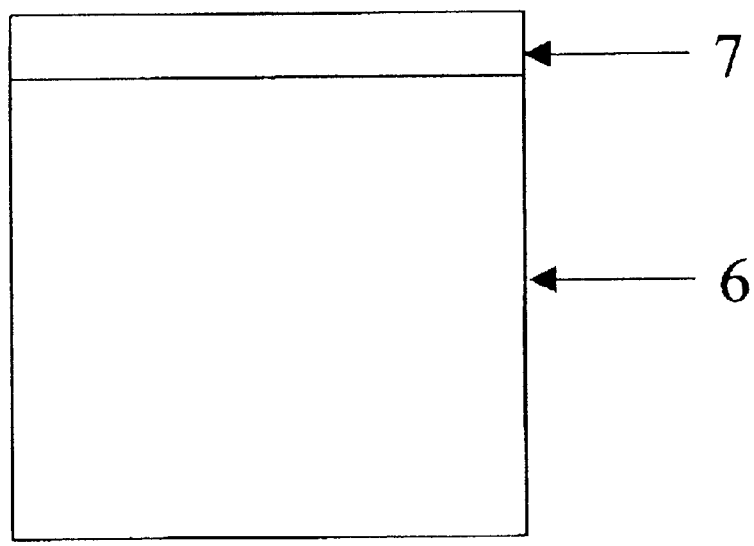
FIG. 11 is a sectional view of a sample employed in a forth embodiment of the present invention and a fourth comparative example.
Figure 12:
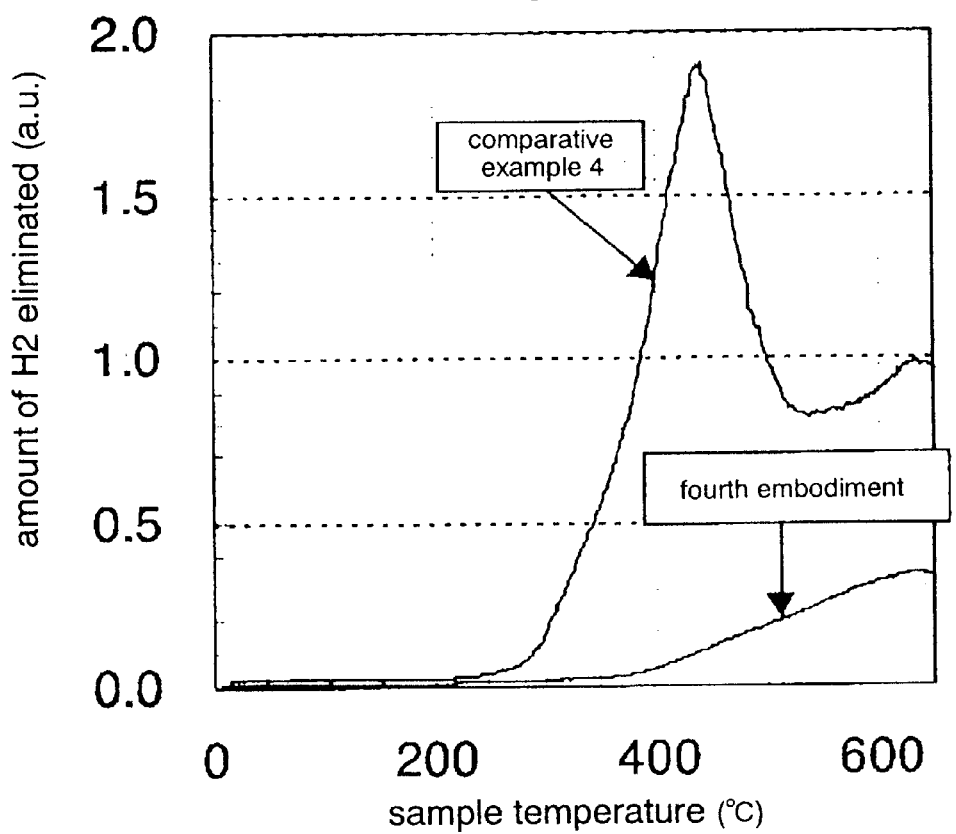
FIG. 12 is a graph showing results of Thermal Desorption Spectroscopy (TDS) of silicon nitride films formed by the forth embodiment and the fourth comparative example.

FIG. 11 is an illustration for describing steps of a fine pattern formation method according to the fourth embodiment and steps of a fine pattern formation method according to comparative example 4. In FIGS. 11 and 12, those elements which are identical with or correspond to those shown in FIGS. 2A through 2F or FIGS. 4A through 4F are assigned the same reference numerals, and repetition of their explanations is omitted here.

As shown in FIG. 11, according to the fourth embodiment and comparative example 4, the silicon nitride film 7 is deposited on the silicon substrate 6 through use of a plasma CVD system (Eagle-10) (ASM Japan Co. Ltd). Detailed requirements for a deposition step are provided in Table 6.

TABLE 6

DEPOSITION CONDITIONS AND OPTICAL CONSTANTS EMPLOYED IN THE FOURTH EMBODIMENT AND COMPARATIVE EXAMPLE 4

| | | COMPARATIVE EXAMPLE 4 | FOURTH EMBODIMENT |
|---|---|---|---|
| COMPONENTS OF SOURCE GAS (mol %) | $SiH_4$ | 13.8 | 15.5 |
| | $N_2$ | 34.5 | 84.5 |
| | $NH_3$ | 51.7 | 0.0 |
| PRESSURE (Pa) | | 450 | 450 |
| DEPOSITION TEMPERATURE (° C.) | | 380 | 510 |
| OPTICAL CONSTANTS (BEFORE BAKING) | n | 2.110 | 2.390 |
| | k | 0.782 | 0.382 |
| OPTICAL CONSTANTS (AFTER BAKING AT 650° C. FOR TEN MIN.) | n | 2.241 | 2.381 |
| | k | 0.451 | 0.374 |

The quantity of hydrogen gas originating from a silicon nitride film during baking is determined through use of a Thermal Desorption Spectroscopy (TDS), which is EMD-WA1000S (Electronic Science Co. Ltd.) in this embodiment, for studying the thermal stability of a silicon nitride film. FIG. 12 shows results of measurement of thermal stability. In FIG. 12, the horizontal axis represents sample temperatures, and the longitudinal axis represents the amount of hydrogen molecules eliminated. On the basis of the silicon nitride film deposited in comparative example 4, it is understood that the silicon nitride film according to comparative example 4 emits hydrogen molecules in larger quantity than does the silicon nitride film deposited in the fourth embodiment.

After baking at 650° C. for ten minutes, the optical constant (i.e., a refractive index and an extinction coefficient) of the silicon nitride film produced in the fourth embodiment is determined. Similarly, after baking at 650° C. for ten minutes, the optical constant (i.e., a refractive index and an extinction coefficient) of the silicon nitride film produced in comparative example 4 is determined. It is ascertained that the optical constant of the silicon nitride film produced in comparative example 4 changes more drastically than does that of the silicon nitride film formed in the fourth embodiment, as measured before and after baking (Table 6). As mentioned above, the requirements employed in the fourth embodiment enable formation of a silicon nitride film which is superior in thermal stability to that produced in comparative example 4.

Although in the embodiment the requirements for depositing the silicon nitride film 7 are set to those provided in Table 6, the requirements are nto limited to those provided in Table 6. Any requirements may be employed, so long as the amount of ammonium contained in source gas assumes a value of 10 mol. % and the temperature for deposition falls within the range of from 400 to 700° C. The present invention is susceptible to various modifications or improvements within the evident scope thereof.

The present invention is embodied in the manner as mentioned previously and yields the following advantages.

The first aspect of the present invention provides a fine pattern formation method comprising the steps of: forming a silicon-nitride-based film directly on a substrate or on a substrate by way of another layer; forming a photoresist directly on the silicon-nitride-based film or on the siliconnitride-based film by way of another layer; exposing the photoresist to light, to thereby transfer a mask pattern onto the photoresist; and etching the silicon-nitride-based film while the thus-transferred resist pattern is taken as a mask. As a result, the present invention enables formation of a high-precision fine pattern during a lithography step.

Preferably, a plasma CVD system is used in the step of depositing the silicon-nitride-based film. Preferably, the temperature at which the substrate is to be situated is set so as to fall within the range of 400 to 700° C. Since the quantity of ammonium contained in material gas is set to a value of 10 mol. % or less, a silicon nitride film exhibiting high thermal stability can be formed. Further, the present invention can prevent thermal deformation in a wafer, which would otherwise occur during formation of the silicon-nitride-based film.

Preferably, after deposition of the silicon-nitride-based film, a silicon oxide film is deposited at a temperature from 400 to 700° C., through use of a plasma CVD system. A photoresist is formed immediately above the silicon oxide film, and the photoresist is exposed to light. Consequently, occurrence of a footing pattern (a rounded corner) in a resist pattern in a boundary surface between the photoresist and the substrate, which would otherwise be caused during the mask pattern transfer step, is prevented, thereby enabling formation of a high-precision fine pattern.

Further, the present invention is not limited to these embodiments, but variations and modifications may be made without departing from the scope of the present invention.

The entire disclosure of Japanese Patent Applications No. Hei 11-155511 filed on Jun. 2, 1999 and Hei 11-230903 filed on Aug. 17, 1999 each including specification, claims, drawings and summary are incorporated herein by reference in those entirety.

What is claimed is:

1. A fine pattern formation method under which a fine pattern is formed by applying a photoresist over an underlying substrate, exposing the photoresist to light of a single wavelength so as to form a fine resist pattern, and etching the underlying substrate while the resist pattern is used as a mark, the method comprising the steps of:

forming a silicon-nitride-based film directly on the underlying substrate or directly on one or more layers formed on the underlying substrate;

forming a photoresist directly on the silicon-nitride-based film or directly on one or more layers formed on the silicon-nitride-based film;

exposing the photoresist to light, to thereby transfer a mask pattern onto the photoresist; and etching the silicon-nitride-based film while the thus-transferred resist pattern is taken as a mask, wherein processing pertaining to the step of depositing the silicon-nitride-based film is effected by means of employing a plasma CVD system, the temperature at which the underlying substrate is to be situated is set so as to fall within the range of from 500 to 700° C.

2. The fine pattern formation method according to claim 1, wherein the silicon-nitride-based film assumes a refractive index of 1.4 to 3.5 and an extinction coefficient of 0.2 to 0.8, with respect to exposing radiation having a wavelength of 195 nm, and has a thickness of 10 nm to 200 nm.

3. The fine pattern formation method according to claim 2, wherein processing pertaining to the step of depositing the silicon-nitride-based film is effected in material gas in which the quantity of ammonium is set to a value of 10 mol. % or less.

4. The fine pattern formation method according to claim 3, wherein a step of depositing a silicon oxide film is performed immediately before the step of forming the photoresist.

5. The fine pattern formation method according to claim 4, wherein the step of depositing the silicon oxide film employs a plasma CVD system.

6. The fine pattern formation method according to claim 2, wherein a step of depositing a silicon oxide film is performed immediately before the step of forming the photoresist.

7. The fine pattern formation method according to claim 6, wherein the step of depositing the silicon oxide film employs a plasma CVD system.

8. The fine pattern formation method according to claim 1, wherein processing pertaining to the step of depositing the silicon-nitride-based film is effected in material gas in which the quantity of ammonium is set to a value of 10 mol. % or less.

9. The fine pattern formation method according to claim 8, wherein a step of depositing a silicon oxide film is performed immediately before the step of forming the photoresist.

10. The fine pattern formation method according to claim 9, wherein the step of depositing the silicon oxide film employs a plasma CVD system.

11. The fine pattern formation method according to claim 1, wherein a step of depositing a silicon oxide film is performed immediately before the step of forming the photoresist.

12. The fine pattern formation method according to claim 11, wherein the step of depositing the silicon oxide film employs a plasma CVD system.

* * * * *